(12) United States Patent
Schoenhense et al.

(10) Patent No.: US 11,328,918 B2
(45) Date of Patent: May 10, 2022

(54) DEVICE AND METHOD FOR ELECTRON TRANSFER FROM A SAMPLE TO AN ENERGY ANALYZER AND ELECTRON SPECTROMETER DEVICE

(71) Applicant: SPECS Surface Nano Analysis GmbH, Berlin (DE)

(72) Inventors: Gerd Schoenhense, Oppenheim (DE); Thorsten Kampen, Berlin (DE); Sven Maehl, Berlin (DE); Oliver Schaff, Berlin (DE)

(73) Assignee: SPECS Surface Nano Analysis GmbH, Berlin (DE)

( * ) Notice: Subject to any disclaimer, the term of this patent is extended or adjusted under 35 U.S.C. 154(b) by 0 days.

(21) Appl. No.: 16/826,243

(22) Filed: Mar. 22, 2020

(65) Prior Publication Data
US 2020/0303177 A1    Sep. 24, 2020

(30) Foreign Application Priority Data

Mar. 21, 2019   (DE) .......................... 102019107327.8

(51) Int. Cl.
*H01J 49/00*    (2006.01)
*H01J 49/06*    (2006.01)
(Continued)

(52) U.S. Cl.
CPC .............. *H01J 49/06* (2013.01); *H01J 37/04* (2013.01); *H01J 37/05* (2013.01); *H01J 37/09* (2013.01);
(Continued)

(58) Field of Classification Search
CPC .. H01J 49/06; H01J 49/46; H01J 2237/24485; H01J 37/252; H01J 37/05;
(Continued)

(56) References Cited

U.S. PATENT DOCUMENTS 5,506,414 A *   4/1996   Coxon ................... H01J 37/06
                                                            250/305
6,104,029 A     8/2000   Coxon et al.
(Continued)

FOREIGN PATENT DOCUMENTS

DE    19701192 A1    7/1998
DE    19929185 A1    1/2001
(Continued)

OTHER PUBLICATIONS

Barrett et al., "Dark field photoelectron emission microscopy of micron scale few layer graphene", Review of Scientific Instruments, vol. 83, pp. 083706 (2012).
(Continued)

*Primary Examiner* — Wyatt A Stoffa
(74) *Attorney, Agent, or Firm* — Caesar Rivise, PC (57) ABSTRACT

An electron imaging apparatus 100 is disclosed, which is configured for an electron transfer along an electron-optical axis OA of an electron 2 emitting sample 1 to an energy analyzer apparatus 200, and comprises a sample-side first lens group 10, an analyzer-side second lens group 30 and a deflector device 20, configured to deflect the electrons 2 in an exit plane of the electron imaging apparatus 100 in a deflection direction perpendicular to the electron-optical axis OA. An electron spectrometer apparatus, an electron transfer method and an electron spectrometry method are also described.

29 Claims, 4 Drawing Sheets

(51) Int. Cl.
　　　*H01J 49/46*　　　(2006.01)
　　　*H01J 37/05*　　　(2006.01)
　　　*H01J 37/04*　　　(2006.01)
　　　*H01J 37/147*　　(2006.01)
　　　*H01J 37/09*　　　(2006.01)
　　　*H01J 37/10*　　　(2006.01)

(52) U.S. Cl.
　　　CPC ............ *H01J 37/10* (2013.01); *H01J 37/147* (2013.01); *H01J 49/46* (2013.01); *H01J 2237/24485* (2013.01)

(58) Field of Classification Search
　　　CPC .. H01J 37/04; H01J 37/09; H01J 37/10; H01J 37/147; H01J 49/44; H01J 49/484
　　　See application file for complete search history.

(56) References Cited

U.S. PATENT DOCUMENTS

| | | | |
|---|---|---|---|
| 6,198,095 B1 | 3/2001 | Staib | |
| 6,492,644 B1* | 12/2002 | Staib | ........................ H01J 37/05 250/287 |
| 7,250,599 B2* | 7/2007 | Funnemann | ............ H01J 37/05 250/281 |
| 9,997,346 B1 | 6/2018 | Baltzer | |
| 2011/0069862 A1* | 3/2011 | Krizek | .................... H01J 49/22 382/100 |
| 2012/0261571 A1* | 10/2012 | Funnemann | .......... H01J 37/252 250/305 |
| 2013/0126727 A1* | 5/2013 | Jozwiak | ............... G01N 23/227 250/305 |
| 2018/0269054 A1* | 9/2018 | Wann | .................... H01J 49/061 |

FOREIGN PATENT DOCUMENTS

| | | |
|---|---|---|
| DE | 102005045622 B4 | 4/2009 |
| DE | 102013005173 B4 | 6/2015 |
| DE | 102014019408 B4 | 2/2017 |
| DE | 102017009299 B3 | 2/2019 |
| EP | 0246841 A2 | 11/1987 |
| EP | 1559126 B9 | 2/2008 |
| EP | 2851933 B1 | 10/2016 |
| EP | 2823504 B1 | 8/2018 |
| SE | 539849 C2 | 12/2017 |

OTHER PUBLICATIONS

Escher et al., "Applications of high lateral and energy resolution imaging XPS with a double hemispherical analyser based spectromicroscope". Journal of Electron Spectroscopy and Related Phenomena, pp. 303-316 (2010).
Third Party Observation re EP20163611A (Feb. 5, 2021).
Patt et al. (2014). Bulk sensitive hard x-ray photoemission electron microscopy, Review of Scientific Instruments, 85, 113704-1, 113704-11.
Wannberg. (2009). Electron optics development for photo-electron spectrometers, Nuclear Instruments and Methods in Physics Research A, 601, 182-194.
English Abstract for DE 102005045622 B4 (2009).
Machine Translation of Abstract for DE 102013005173 B4 (2015).
Machine Translation of Abstract for DE 102014019408 B4 (2017).
Machine Translation of Abstract for DE 102017009299 B3 (2019).
Szilagyi, M. (2012). Electron and ion optics. Springer Science & Business Media, Chapter 9, "Computer-Aided Optimization and Synthesis of Electron and Ion Lenses" pp. 423-460.

\* cited by examiner

DEVICE AND METHOD FOR ELECTRON TRANSFER FROM A SAMPLE TO AN ENERGY ANALYZER AND ELECTRON SPECTROMETER DEVICE

CROSS-REFERENCE TO RELATED APPLICATIONS

This application claims priority to DE 10 2019 107 327.8, filed Mar. 21, 2019, the contents of which are incorporated herein by reference in their entireties for all purpose

FIELD OF THE INVENTION

The invention relates to an electron imaging apparatus and an electron transfer method for transferring electrons from a sample to an energy analyzer apparatus, in particular for momentum- and energy-resolved detection of electrons, such as e.g. photoelectrons. The invention further relates to an electron spectrometer apparatus that is provided with the electron imaging apparatus, and an electron spectrometry method. Applications of the invention lie in the electron spectroscopic analysis of samples.

BACKGROUND OF THE INVENTION

In the present description, reference is made to the following prior art documents, which illustrate the technical background to the invention:
[1] B. Wannberg in "Nucl. Instrum. Meth. A" 601 (2009) 182;
[2] EP 2 823 504 B1;
[3] U.S. Pat. No. 9,997,346 B1;
[4] EP 2 851 933 B1;
[5] SE 539 849 C2;
[6] DE 10 2005 045 622 B4;
[7] DE 10 2013 005 173 B4;
[8] EP 1 559 126 B9;
[9] DE 10 2014 019408 B4; and
[10] M. Patt et al. in "Review of Scientific Instruments" 85, 113704 (2014).

The use of transfer optics with electron-optical lenses is generally known for transferring and focusing electrons from a solid sample to an energy analyzer, in particular for the measurement of photoelectrons and Auger electrons. Various types of energy analyzers and associated transfer optics are known. A group of methods, in which the electrons emitted from the sample are detected with angular resolution are known as ARPES methods (ARPES: angular-resolved photo-electron spectroscopy) (see e.g. [1]). In the ARPES methods, the emission angle relative to a reference axis, e.g. a surface normal of the sample surface, at which electrons are emitted from the sample, is of particular interest. Although high angle resolutions were achieved in the past, this was only within relatively limited angle ranges. For example, a high resolution of 0.1° in an angle range of approximately +/−7° and a reduced resolution of 0.5° in a range of approximately +/−15° has hitherto been achievable.

Hemispherical analyzers assembled from two concentric hemispherical electrodes are typically used as energy analyzers in conventional angular imaging using ARPES methods. Depending upon the voltage between the hemispherical electrodes, only particles in a specific energy band (e.g. energy interval with a width of 10% of the pass energy of the hemispherical analyzer) are allowed to pass through the hemispherical analyzer. Imaging of the angular distribution of the electrons on an entry plane of the energy analyzer is provided for an energy- and angular-resolved measurement. An angular distribution image of electrons from the sample is generated in the entry plane of the energy analyzer in real space (in polar coordinates). Since a slit diaphragm is arranged as an entrance slit in the entry plane of a hemispherical analyzer, said hemispherical analyzer is able to determine the angular distribution along a first angular coordinate (e.g. along the y-direction) along the extent of the entrance slit. In order to also determine the angular distribution along a second coordinate (e.g. x) perpendicular to the first angular coordinate, an arrangement of two deflectors [2] or one deflector [3] in the transfer lens sequentially scans (scanning movement) the angular distribution image perpendicular to the extent of the entrance slit and to the electron-optical axis.

Figure 7:
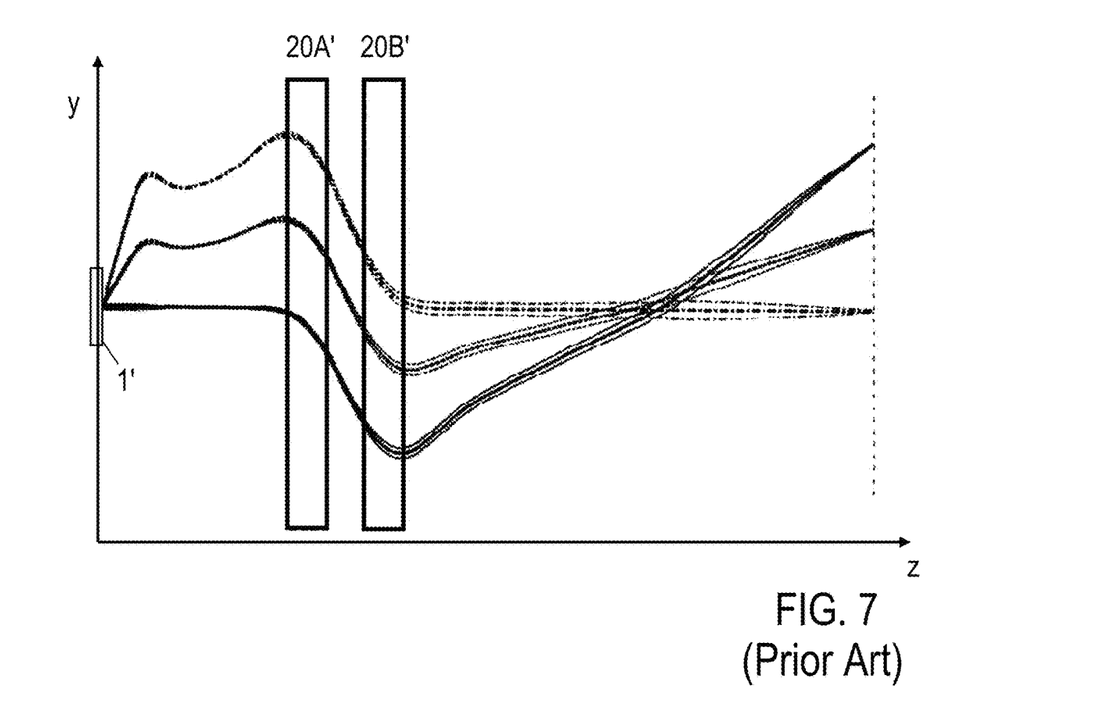
FIG. 7: a diagram of beam trajectories of a conventional transfer optical system (cited from [2]).

Conventional transfer optics for angular-resolved measurement of electrons have a major disadvantage in that, at the outlet from the transfer optics and/or in the entry plane of the energy analyzer, the electron beam enters the energy analyzer with a marked divergence relative to the electron-optical axis, e.g. z-axis, of typically >10°. The divergence is illustrated in FIG. 7 (prior art, cited from [2] using the example of the trajectory of a few electron partial beam from a sample 1' with different emission angles in a y-z-plane (see also [1] and [3]). It causes imaging errors in the energy analyzer and requires a significant amount of postprocessing effort to calculate energy- and angular distributions of the electrons. Furthermore, conventional transfer optics do not have a sufficiently well focused and localized position space image of the sample source spot, from which the electrons are emitted (see e.g. [1]).

The divergence is particularly disadvantageous in the acquisition of the angular distribution along the second angular coordinate, wherein the second angular coordinate is sequentially scanned with the aid of one or two deflectors 20A', 20B' in the transfer optics (see [1], [2], [3], [4] and [5]). With the scanning motion of the divergent beam perpendicular to the extent of the entrance slit, combination errors are created from the beam divergence in the entry plane in combination with aberrations induced by the deflection of the beam by the deflectors.

The beam divergence in the entry plane is also disadvantageous in spin-resolved electron spectroscopy, in which an imaging spin-filter with a spin-filter crystal is arranged at the outlet of the energy analyzer (see [6]). The beam divergence along the entrance slit in the entry plane causes a beam divergence in the exit plane in the form of a marked astigmatism, which makes a well-focused image of the exiting beam on the spin-filter crystal impossible.

In summary, the high angular divergence of the electron beam at the end of conventional transfer optics has considerable disadvantages for angular-resolved spectroscopy of electrons using energy analyzers, in particular using hemispherical analyzers. These disadvantages limit the potentially detectable angular intervals and the effect is even greater when the scanning motion is used to capture the second angular coordinate, and when an imaging spin-filter is used.

Documents [7], [8], [9] and [10] describe additional transfer optics intended for momentum microscopy and containing telescopic beam paths, in which there are Gaussian images (real space images) and momentum distribution images (momentum space images). However, these transfer optics are not designed for the scanning motion of a momentum distribution image perpendicular to the extent of an entrance slit of an energy analyzer. Furthermore, all these techniques are based on the use of cathode lenses, wherein the electrons are accelerated into the transfer optics by means of a strong electrostatic extractor field. However, the strong extractor field is disturbing in the examination of non-planar surfaces (such as can occur e.g. after splitting of a sample in the UHV), microstructures (such as e.g. semiconductor components) or microcrystals with a three-dimensional structure (common test objects of new quantum materials).

The objective of the invention is to improve an electron imaging apparatus, an electron transfer method, an electron spectrometer apparatus and/or an electron spectrometry method in such a way as to avoid disadvantages of conventional techniques. The objective is particularly to minimize or even eliminate divergence-induced imaging errors, achieve a better angular resolution, achieve the detection of larger angular intervals and/or simplify spin-resolved electron spectroscopy.

These objectives are correspondingly achieved by an electron imaging apparatus, an electron transfer method, an electron spectrometer apparatus and an electron spectrometry method of the invention.

BRIEF SUMMARY OF THE INVENTION

According to a first general aspect of the invention, the above objective is achieved by an electron imaging apparatus that is configured for an electron transfer along an electron-optical axis from an electron-emitting sample to an energy analyzer apparatus. The electron transfer comprises a transfer and imaging of the emitted electrons (also referred to as electron bundle or electron beam) from an entry plane to an exit plane of the electron imaging apparatus, wherein the entry plane is provided on the surface of the sample facing towards the electron imaging apparatus and the exit plane is provided on the rear side of the electron imaging apparatus facing towards the energy analyzer apparatus and are consequently also referred to as sample-side and analyzer-side entry plane and exit plane respectively. The electron-optical axis is preferably a continuous straight axis extending perpendicular to the entry and exit planes but can alternatively have an angled course that is straight in sections.

The electron imaging apparatus comprises a sample-side first lens group, an analyzer-side second lens group and a deflector device configured for electrical and/or magnetic deflection of the electrons in the exit plane of the electron imaging apparatus in a deflection direction perpendicular to the electron-optical axis. Each of the first and second lens group comprises at least two electron-optical lenses. The first and the second lens group and the deflector device are each connected to a control circuit to provide operating voltages, wherein the control circuits can be separate components or connected to a common control device.

According to the invention, the first lens group is configured to form a first reciprocal plane inside the first lens group and a first Gaussian plane between the first and the second lens group and to generate a first momentum distribution image of a momentum distribution of electrons from the sample in the first reciprocal plane and to generate a first Gaussian image of the sample, in particular of the illuminated sample source spot, in the first Gaussian plane. A reciprocal plane is an imaging plane in which there is a reciprocal image (also known as a momentum image or Fourier image). Accordingly, the first reciprocal image, referred to here as a momentum distribution image, is focused in the first reciprocal plane. The momentum distribution image is an image of the momentum distribution of the electrons, wherein the transverse momentum of the electrons increases with increasing distance of the partial beams of the momentum distribution image from the electron-optical axis. The control circuit of the first lens group is configured to apply suitably adapted control voltages to the first lens group for electron-optical imaging of the first reciprocal plane and the first Gaussian plane.

Moreover, according to the invention, the second lens group is configured to form a second reciprocal plane on the analyzer side of the second lens group and to generate a second momentum distribution image of the momentum distribution of the electrons from the sample in the second reciprocal plane. The control circuit of the second lens group is configured to apply suitably adapted control voltages to the second lens group for electron-optical providing of the second reciprocal plane.

Moreover, according to the invention, the first lens group is configured to generate the first Gaussian image with such a small dimension (extent of image perpendicular to the optical axis) that the second momentum distribution image generated by the second lens group is a parallel image.

The deflector device preferably acts in a Gaussian plane, e.g. in the first Gaussian plane or in another Gaussian plane (see below), of the electron imaging apparatus, so that the deflection of the electrons advantageously effects a parallel displacement of the partial beams, which form the parallel image in the second reciprocal plane, without changing the angle between the partial beams perpendicular to the optical axis.

The term "parallel image" (or: substantially parallel angular image or momentum distribution image with substantially parallel partial beams) hereinafter refers to a momentum distribution image, the partial beams of which run parallel to the electron-optical axis on passing through the second reciprocal plane and/or have such a minimal divergence that aberrations (in particular divergence-induced imaging errors) in the energy analyzer apparatus are negligibly small for the desired energy-resolved measurement of electrons, in particular do not cause any significant impairment of the spectroscopic properties (energy resolution, momentum resolution) of the energy analyzer apparatus. The parallel image is composed of partial beams that are aligned perpendicular or virtually perpendicular to the second reciprocal plane. The partial beams enter the energy analyzer apparatus as parallel bundle. The substantially perpendicular alignment of the partial beams extends over an angular range of the electrons emitted from the sample that is to be detected in the subsequent energy analysis in the energy analyzer apparatus.

The control circuit of the first lens group is configured to generate the control voltages of the first lens group such that the first Gaussian image is of the desired size. The geometry of the electron-optical lenses of the first lens group is preferably configured such as to produce the smallest possible Gaussian image of the source spot of the electrons on the sample, in the first Gaussian plane. Optimization of the geometry of the electron-optical lenses takes place e.g. by numerical simulations.

The parallel image (parallel momentum distribution image in the exit plane) preferably has angular deviations (divergences) of its partial beams that are smaller than 0.4°, particularly preferably smaller than 0.2°. In simulations, the angular deviations have shown themselves to be small enough (see below, FIG. 2) not to compromise the subsequent imaging in the energy analyzer apparatus.

According to a further advantageous embodiment of the invention, the first lens group is configured to generate the first Gaussian image with an extent perpendicular to the electron-optical axis of less than 1 mm, in particular less than 0.5 mm. For these size ranges, the parallel momentum distribution image is advantageously achieved with sufficiently small angular deviations in the typical measurement tasks that occur in practice and in the typical configurations of electron optics.

The control circuit of the deflector device is configured for a scanning deflection of the momentum distribution image in the second reciprocal plane perpendicular to the electron-optical axis. Accordingly, the electrons in the exit plane of the electron imaging apparatus are subjected to a scanning motion in a direction that deviates from the extent of an entrance slit (also referred to as slit or slit diaphragm) of the energy analyzer apparatus, preferably perpendicular to the entrance slit. The configuration of the first and second lens groups and the deflector device or correspondingly related control circuits is adjusted on the basis of calculations using electron-optical imaging equations that are known per se and the geometric size of the electron imaging apparatus.

According to a second general aspect of the invention, the above objective is achieved by an electron spectrometer apparatus comprising a sample-holder to hold a sample, the electron imaging apparatus according to the first general aspect of the invention or an embodiment thereof and an energy analyzer apparatus. According to the invention, the electron imaging apparatus is configured for the transfer and imaging of electrons emitted from the sample along the electron-optical axis to the energy analyzer apparatus and for the scanning motion of the momentum distribution image perpendicular to the electron-optical axis and in a deflection direction, which deviates from the extent of an entrance slit of the energy analyzer apparatus, preferably in a deflection direction perpendicular to the extent of the entrance slit. The electron imaging apparatus is configured such that a momentum distribution image of the electrons emitted from the sample source spot is generated as a parallel image in the entry plane of the energy analyzer apparatus.

The energy analyzer apparatus is generally an electron-optical imaging device configured for an angular- or momentum-resolved detection of the angular- or momentum distribution image along at least one direction perpendicular to the electron-optical axis. The energy analyzer apparatus preferably comprises a hemispherical analyzer (hemispherical electron energy analyzer). By using the hemispherical analyzer with entrance slit, it is possible to determine the angular distribution in a direction along the entrance slit and in a second, deviating direction by the scanning motion of the momentum distribution image by means of the deflector device. As an alternative to using a hemispherical analyzer, the energy analyzer apparatus can comprise other types of analyzers such as e.g. a cylinder analyzer or a 127° analyzer.

According to a third general aspect of the invention, the above objective is achieved by an electron transfer method, wherein electrons are transferred by an electron imaging apparatus from a sample along an electron-optical axis to an energy analyzer apparatus.

The sample preferably comprises a solid sample, the surface of which is exposed for an irradiation with excitation light and for the emission towards the electron imaging apparatus. The electrons emitted from the source spot (incident surface of the excitation light beam) are sequentially transferred through a sample-side first lens group, a deflector device and an analyzer-side second lens group, wherein the electrons are deflected by the deflector device in an exit plane of the electron imaging apparatus in a deflection direction running perpendicular to the electron-optical axis and deviating from the extent of the entrance slit of the energy analyzer apparatus, preferably is aligned perpendicular to the extent of the entrance slit. According to the invention, the first lens group forms a first reciprocal plane within the first lens group and a first Gaussian plane between the first and the second lens groups, generating a first momentum distribution image of a momentum distribution of electrons from the sample in the first reciprocal plane and a first Gaussian image of the source spot in the first Gaussian plane. Moreover, the second lens group forms a second reciprocal plane on the analyzer side of the second lens group and a second momentum distribution image of the momentum distribution of the electrons from the sample in the second reciprocal plane. The first lens group generates the first Gaussian image with such a small dimension that the second momentum distribution image generated by the second lens group is a parallel image. The electron transfer method is preferably executed by the electron imaging apparatus according to the first general aspect of the invention or embodiments thereof.

According to a fourth general aspect of the invention, the above objective is achieved by an electron spectrometry method (method for detecting the energy and momentum distribution of electrons that have been emitted from a sample) comprising an irradiation of a sample and emission of electrons from the sample, a transfer of the emitted electrons by an electron transfer method according to the third general aspect of the invention or an embodiment thereof to an energy analyzer apparatus and a momentum- and energy-resolved detection of the electrons by the energy analyzer apparatus. The electron spectrometry method is preferably executed by the electron imaging apparatus according to the second general aspect of the invention or an embodiment thereof.

The present invention advantageously provides apparatuses and methods for substantially improving the beam transfer for electrons emitted from a solid sample in preferably field-free environment and analyzed in the energy analyzer apparatus in terms of their energy- and momentum distribution. Imaging errors that occur in conventional electron imaging apparatuses with the generation of angular images in the real space are avoided by the generation of a momentum distribution image as a parallel image. Since a suitably small Gaussian image of the area illuminated by the excitation source (sample source spot) is positioned in a front focal plane of the second lens group, so that the momentum distribution image that is focused in the plane of the entrance slit of the energy analyzer apparatus, is created from parallel partial beams in a rear reciprocal plane of this lens group, all electrons enter the energy analyzer apparatus substantially parallel to the electron-optical axis. As a result, the angular deviations at the entrance of the energy analyzer apparatus are reduced by 1 to 2 orders of magnitude relative to conventional methods. The first Gaussian image is generated by means of the first lens group, which is preferably aberration-minimized by means of suitable geometry.

An important advantage of the invention therefore lies in the possibility of capturing substantially larger angular ranges of the electrons emitted from the sample. Since the relationship between the transverse momentum $k_1$ and image angle $\alpha$ scales with the root of the energy: $k_1 \sim \sin \alpha \sqrt{E_{kin}}$, at lower kinetic energies (e.g. equal to or less than 5 electron volts, such as in laser excitation, for example), angular intervals of more than +/−30° are possible and this considerably enhances the efficiency of the energy analyzer. Particular advantages of the invention also result from scanning of the second momentum coordinate to measure a two-dimensional momentum distribution and from the use of an imaging spin-filter. By positioning the deflector device in the first Gaussian image and focus of the second lens group, it is possible to achieve a parallel displacement of the momentum distribution image in the entry plane of the energy analyzer apparatus preferably with a single deflector unit, wherein the parallelism of the beam is preserved.

The aberrations of the combination of lens groups and deflector device can be advantageously reduced to the theoretically possible minimum, in that the image reciprocal to the desired momentum distribution image (i.e. the first Gaussian image of the source spot on the sample) is so small that the coding of the momentum distribution image is defined with extreme precision as a trajectory in this small Gaussian image. This characteristic distinguishes the present invention from all conventional beam transfer systems, in particular those according to [1, 2, 3, 4 and 5].

The inventors have found that, using the technique according to the invention, a concept realized in electron microscopy, in particular the creation of predetermined, very well focused real space images and reciprocal images in predetermined imaging planes using the optical image transition theorem, not only serves to reduce aberrations in the electron-optical system in electron spectroscopy but offers an additional substantial advantage: since the first Gaussian image can be displaced along the electron-optical axis by means of the first lens group, the tilt angle of the individual partial beams of the momentum distribution image can be minimized in the entry plane of the energy analyzer apparatus, without losing the beam position. This allows the deflection technique to be used for scanning the second momentum direction, in particular perpendicular to the entrance slit, even for high retardation conditions (ratio of the initial kinetic energy of the electrons on exit from the sample to the kinetic energy on entry into the energy analyzer apparatus). The preferred embodiment of the second lens group in the form of a zoom lens (lens that is configured for adjustment of an image magnification and preferably comprises five or more lens elements) makes it possible, in particular, to vary the image size and electron energy of the momentum image at the outlet of the electron imaging apparatus within broad limits and so adapt the momentum image size and energy to the desired conditions for the energy analyzer (energy resolution, momentum resolution).

The creation of the parallel image in the entry plane of the energy analyzer apparatus also advantageously simplifies a spin-resolved electron spectroscopy, since image errors on a spin-filter crystal at the outlet of the energy analyzer are reduced or avoided altogether.

A further particularly important advantage of the invention is that deflection of the momentum distribution image is simplified. Thus, in a preferred embodiment of the invention, it is provided that the deflector device only acts in a single plane perpendicular to the electron-optical axis. On transfer of the electrons along the electron-optical axis, the deflector device acts one single time, when the electrons pass through the space between the first lens group and the second lens group. This advantageously avoids conventional, complex double deflectors, e.g. according to [2], without having to accept imaging errors. Particularly preferably, the deflection plane of the deflector device and the first Gaussian plane (or another Gaussian plane, see below) coincide, so that an exact parallel displacement of the momentum distribution image in the second reciprocal plane is facilitated by actuating the deflector device. This completely avoids any additional beam tilting, such as is described in [3] and [5] for example.

Deflection in one single plane has the further advantage that the deflector device can be of particularly simple construction, e.g. with one single pair of electrically and/or magnetically acting deflector elements, a quadrupole arrangement or an octupole arrangement of deflector elements. In the case of electrical deflection, the deflector elements comprise deflecting electrodes and, in the case of magnetic deflection, the deflector elements comprise deflecting coils. The octupole arrangement advantageously allows a rotation of the deflection direction around the electron-optical axis, so that the deflector device can additionally rotate the direction of displacement of the momentum distribution image relative to the alignment of the entrance slit of the energy analyzer apparatus and, in this way, compensate for any undesirable image rotations due to magnetic stray fields, for example.

According to a further advantageous embodiment of the electron imaging apparatus (hereinafter also referred to as the first embodiment), the second reciprocal plane is at the same time the exit plane of the electron imaging apparatus, wherein a slit diaphragm, which forms the entry slit of the energy analyzer apparatus, is arranged in the second reciprocal plane. This embodiment offers the advantages of an adjustment of the parallel image directly on entry into the energy analyzer apparatus and a relatively compact construction.

According to alternative embodiments of the electron imaging apparatus, it has at least one third lens group, which is arranged on the analyzer side of the second lens group, i.e. in the overall arrangement of the electron spectrometer apparatus, between the second lens group and the energy analyzer apparatus. The at least one third lens group forms the second Gaussian plane within the at least one third lens group and a third reciprocal plane on the analyzer side of the at least one third lens group, so that a second Gaussian image of the sample in the second Gaussian plane is created by the at least one third lens group and a third momentum distribution image of the momentum distribution of the electrons from the sample is created in the third reciprocal plane. The third reciprocal plane is the exit plane of the electron imaging apparatus and the entry plane of the energy analyzer apparatus and the third momentum distribution image generated by the at least one third lens group is a parallel image. Even in the case of these alternative embodiments of the invention, the scanning motion of the momentum distribution image, which effects a corresponding deflection of the momentum distribution image in the third reciprocal plane, is provided. The at least one third lens group is provided with a control circuit configured to apply suitably adapted control voltages to the at least one third lens group for electron-optical forming of the third reciprocal plane and the second Gaussian plane. The provision of the at least one third lens group has the particular advantage that the beam energy in the parallel momentum distribution image can be varied in the entry plane of the energy analyzer apparatus within a range of e.g. two orders of magnitude, so allowing optimum resolution and transmission settings of the energy analyzer apparatus.

A slit diaphragm can be arranged in the second reciprocal plane in front of the third lens group to form the entrance slit of the energy analyzer apparatus (hereinafter referred to as the second embodiment). In this case, the slit diaphragm is not positioned directly in the entry plane of the energy analyzer apparatus but in the second reciprocal plane, which is conjugated to the entry plane, in front of the third lens group, where the parallel momentum distribution image is generated, so that a real image of the slit diaphragm overlaid by the parallel momentum distribution image is generated in the entry plane of the analyzer. In this arrangement, the electrons can advantageously pass through the entrance slit with much greater energy, which improves subsequent imaging in the energy analyzer apparatus. Since the slit diaphragm is arranged in the second reciprocal plane, the slit diaphragm can be imaged as a real image in the entry plane of the energy analyzer apparatus, so that the effective slit diaphragm width and energy of the electrons in the entry plane can be electron-optically varied, while the physical slit diaphragm width being fixed.

Alternatively, the slit diaphragm forming the entrance slit of the energy analyzer apparatus can be arranged in the third reciprocal plane and forms the entrance slit of the energy analyzer apparatus, wherein, in this case, no slit diaphragm is arranged in the second reciprocal plane (hereinafter also referred to as the third embodiment). The third embodiment offers the particular advantage that an energy analyzer of conventional design, i.e. with integrated entrance slit, can be used.

According to further modified embodiments of the invention, a fourth lens group or additional lens groups, which are each constructed like the third lens group and provide additional Gaussian planes and reciprocal planes, can be provided.

Advantageously, there are various options for positioning the deflector device. Particularly in the first, second and third embodiment of the invention, the deflector device can be disposed between the first and the second lens group and in the first Gaussian plane. Alternatively, in the second and third embodiment of the invention, the deflector device can be disposed at the third lens group and in the second Gaussian plane. According to further alternatives, the deflector device can be disposed in a further Gaussian plane in the fourth lens group or an additional lens group.

A further important difference relative to electron-optical concepts of electron momentum microscopy is achieved by an advantageous embodiment of the invention, wherein the sample-side foremost electron-optical lens element of the first lens group is configured to have the same potential like the sample. Advantageously, this keeps the area around the sample field-free so that it is also possible to examine samples with highly three-dimensional structures or microcrystals without any significant field distortion due to the three-dimensional shape, which would compromise momentum resolution.

For displacement of the momentum distribution image in the second reciprocal plane the deflector device particularly preferably acts in the first Gaussian plane. Arrangement in the first Gaussian plane means that the deflector device generates varying deflector fields, which act in a narrow range symmetrically around the first Gaussian plane. This embodiment has the advantages of a particularly effective deflection of the entire electron beam, wherein the parallelism of the momentum image at the outlet of the imaging device is preserved. Alternatively, when providing the third lens group, the single deflector device can be arranged in the second Gaussian plane and act on the electrons in the second Gaussian image, wherein the parallelism of the momentum image is likewise preserved at the outlet of the imaging device on deflection.

According to a further advantageous embodiment of the invention, it is provided that the analyzer-side rearmost electron-optical lens of the second lens group forms a field-free space in the region of the second reciprocal plane. Alternatively or additionally, it is provided in the second or third embodiment that the third lens group has boundary elements at its ends, said boundary elements being configured to form field-free spaces adjacent to both sides of the third lens group. This embodiment prevents any electrostatic feed-over of fields leading to a deflection of the electron pathways and hence to a distortion of the momentum image.

BRIEF DESCRIPTION OF THE DRAWINGS

Further details and advantages of the invention are described below with reference to the attached drawings. The drawings show in.

DETAILED DESCRIPTION OF PREFERRED EMBODIMENTS

The invention is described below with exemplary reference to an electron imaging apparatus in combination with a hemispherical analyzer. The invention is not limited to the use of the hemispherical analyzer but is also executable with other types of energy analyzer apparatuses. Details of the excitation of a sample and recording of energy distributions of the electrons emitted from a sample with the hemispherical analyzer are not described, since these are known per se from conventional techniques. The illustrations of the electron-optical components in the drawings are schematic illustrations. Details such as e.g. the arrangement of the electron-optical components in an evacuated space or the formation of electron-optical lenses from spaced lens elements, are not shown. In general, e.g. electron-optical lenses and the associated control circuits can be the same as those essentially known from conventional transfer optics.

The Figures are described with reference to the relevant spatial directions shown in FIG. 1, which, in the position-space, comprise the z direction along the electron-optical axis and, perpendicular to this, the x and y directions, wherein a slit diaphragm 201 in the entry plane of the energy analyzer apparatus 200 (see also FIG. 6) extends in the y direction. Accordingly, the direction of the slit diaphragm defines the direction of the momentum coordinate $k_y$ and, perpendicular to it, the momentum coordinate $k_x$.

Figure 1:
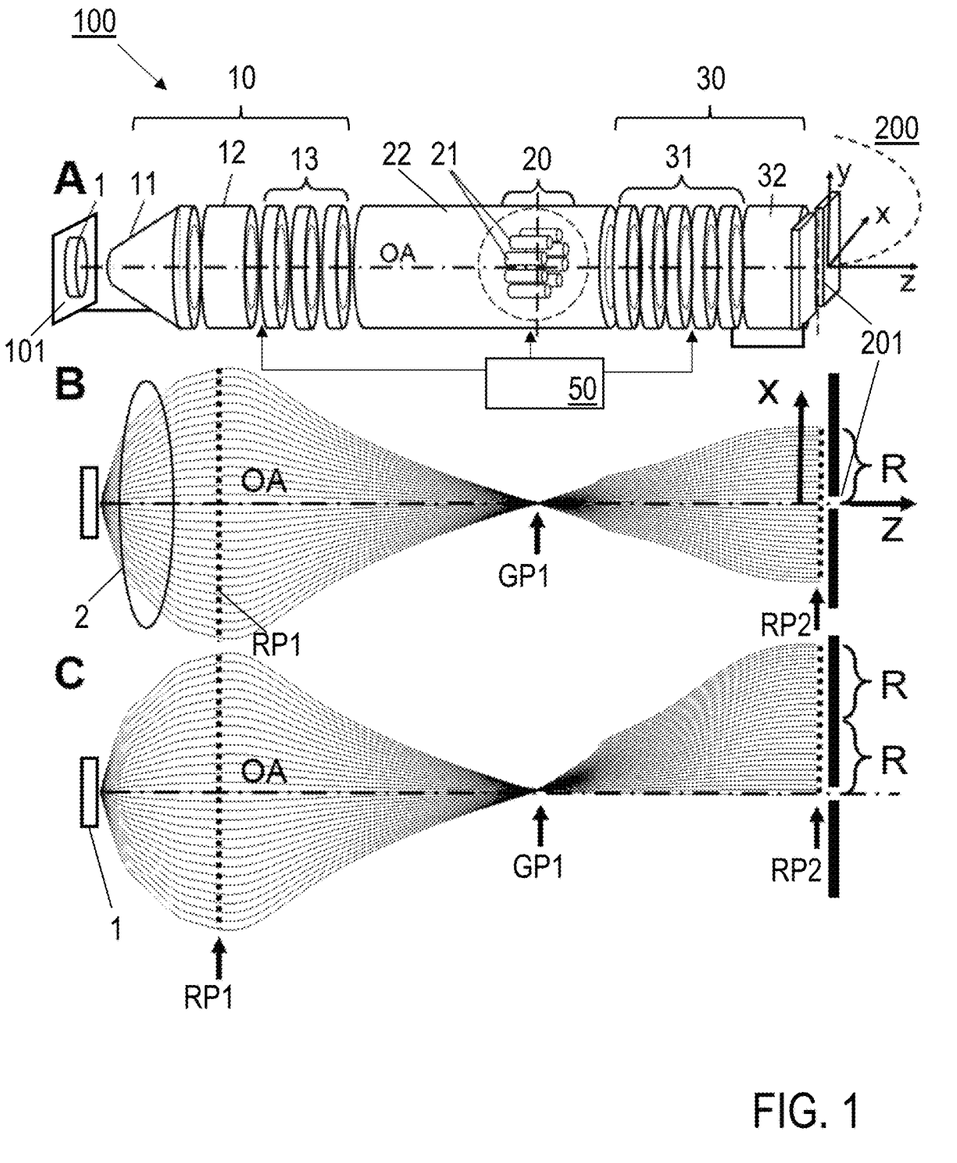
FIG. 1: schematic illustrations of the first embodiment of the electron imaging apparatus according to the invention.

FIG. 1 shows the first embodiment of the electron imaging apparatus 100 according to the invention in the form of an electron-optical system for the transfer and transverse displacement of a parallel momentum distribution image based on an electron-optical column with multiple lens groups 10, 30 and a field-free drift path 22, in which is disposed a deflector device 20. FIG. 1A shows the construction of the electron imaging apparatus 100, FIG. 1B shows the simulated beam path for a realistic optics with the deflector device 20 switched off, and FIG. 1C shows the simulated beam path for the same lens settings as in FIG. 1B, but with the deflector device 20 switched on by applying suitable voltages to the deflector electrodes 21. In FIGS. 1B, C, and in all representations of electron trajectories in FIGS. 2, 3 and 4, the radial coordinate is radially enlarged to show the details of the individual beams more clearly. The lens groups 10, 30 and the deflector device 20 are connected to a control device 50, comprising control circuits for energizing the electron-optical lenses or electrodes of the components 10, 20 and 30. The electron imaging apparatus 100 is arranged on a sample-holder 101 with a distance of e.g. 15 mm between the surface of a sample 1 and a front cap electrode 11 of the first lens group 10, such that the sample 1 is located in the object plane of the first lens group 10. The length of the slit diaphragm 201 is e.g. 20 mm to 40 mm, and its width is e.g. 50 µm to 2 mm.

Specifically, the first lens group 10 according to FIG. 1A comprises a front cap electrode 11, a focusing electrode 12 and adapter lenses 13. In order to create a field-free space between the sample 1 and the first lens group 10, the sample-holder 101 can be electrically connected to the front cap electrode 11 so that both components are at the same electrical potential. The second lens group 30 comprises multiple lens elements 31, which preferably form a zoom lens, and a boundary element 32 to create a field-free space between the rearmost lens element and the slit diaphragm 201 of the energy analyzer apparatus 200. To this end, the boundary element 32 and the slit diaphragm 201 are electrically connected to each other.

An e.g. cylindrical element is provided to form the field-three drift path 22 between the first lens group 10 and the second lens group 30, the length of said cylindrical element being such that any feed-over of the adjacent lens groups is reduced and there is no longer any significant electrical field, which could deflect the electron trajectories in the region of the Gaussian image, at the site of the deflector device when it is switched off.

Figure 5:
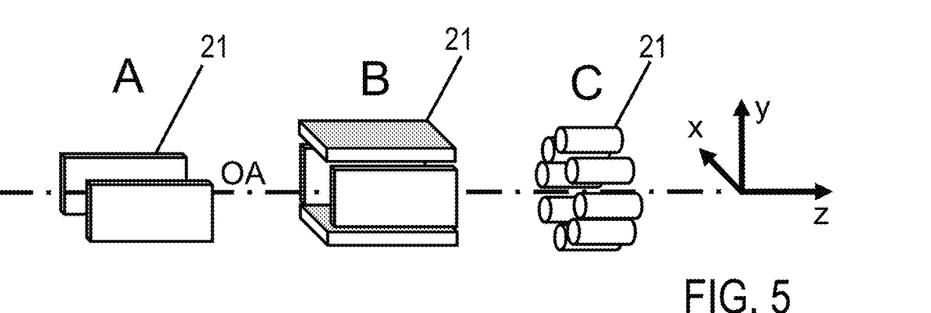
FIG. 5: schematic illustrations of different variants of a deflector device.

The deflector device 20 comprises e.g. an octupole arrangement of deflecting electrodes 21 or alternatively another electrode arrangement (see FIG. 5). The deflector device 20 is preferably a single deflector, i.e. the electrons are deflected once only as they pass through the first Gaussian plane on their way along the electron-optical axis OA between the sample and the second reciprocal plane.

When the sample 1 is excited by light (see also FIG. 2), an ensemble of electrons 2 is emitted from the sample (FIG. 1B), wherein the electrons 2 are imaged by the first lens group 10 up to a predetermined emission angle of e.g. +/−15° along the electron-optical axis OA. According to FIG. 1B, which shows the electron imaging apparatus 100 in the x-z plane with the slit diaphragm 201 of the energy analyzer apparatus 200 perpendicular to the drawing plane, the first lens group 10 generates a reciprocal image of the electrons 2 emitting sample source spot in the first reciprocal plane RP1 and a first Gaussian image of the sample source spot in the first Gaussian plane GP1, which is a posterior focal plane of the first lens group 10. A second reciprocal image (momentum distribution image with parallel partial beams) is imaged with the second lens group 30 into the entrance slit of the energy analyzer apparatus 200. It is thereby guaranteed that all electrons enter the energy analyzer apparatus 200 as parallel partial beams with very small angular deviations. The first lens group 10 is controlled such that the intersection of the first Gaussian plane GP1 with the electron-optical axis OA is positioned in the deflection plane of the deflector device 20, in particular in the center of the deflector device 20. Centering of the Gaussian image on the deflector device 20 allows precise parallel displacement of the momentum distribution image with parallel partial beams generated by the second lens group 30 in the second reciprocal plane RP2. By applying suitable voltages to the deflector device 20, parallel displacement of the momentum distribution image in the second reciprocal plane RP2 is possible without additional tilting of the beam, as shown in FIG. 1C.

FIG. 1C shows the effect of the deflector device 20 acting in the first Gaussian plane GP1 to provide optimized lens geometry and practical measuring conditions (+/−15° angular interval, kinetic energy on the sample 16 eV, which suits a conventional vacuum ultraviolet laboratory light source). In the illustrated example, at the power of the deflector device 20 set by the voltages on the deflecting electrodes 21, the analyzer-side momentum distribution image in the second reciprocal plane RP2 is displaced in parallel by a momentum radius R. Diameter 2R and parallelism of the momentum distribution image are preserved on parallel displacement. Thus, by continuous variation of the deflecting force of the deflector device 20 by means of a control circuit (control device 50), the two-dimensional momentum image can be fully scanned.

Figure 2:
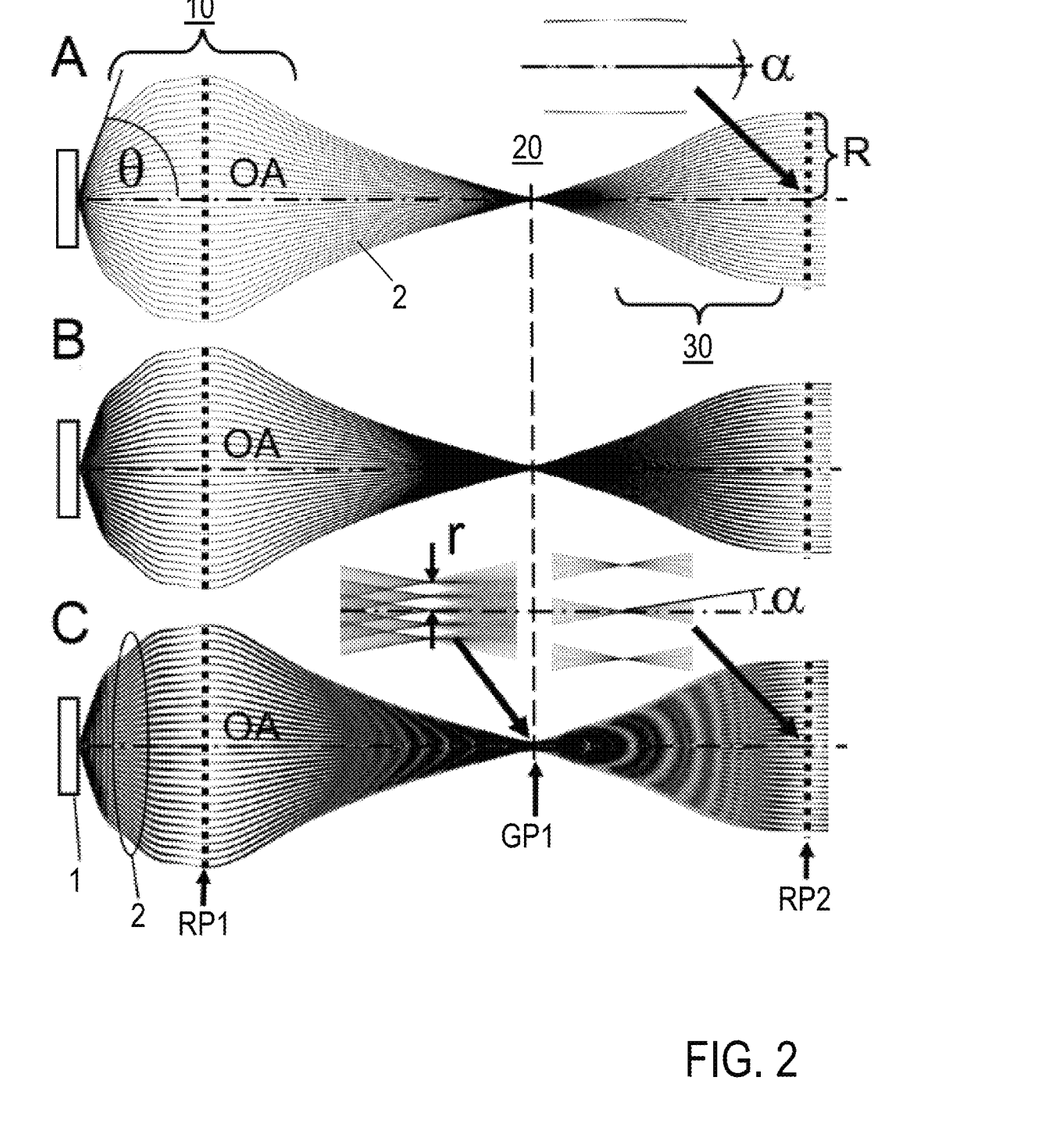
FIG. 2: further illustrations of the generation of a Gaussian image on excitation of a sample by various excitation sources.

FIG. 2 shows the beam trajectory of the electrons 2 as in FIG. 1B with different excitation sources (not shown) to generate the electrons 2, wherein FIG. 2A shows excitation by the light beam of a synchrotron radiation source or a laser, FIG. 2B shows excitation by a focused vacuum UV excitation source and FIG. 2C shows excitation by an unfocused vacuum UV excitation source.

The angle θ designates the emission angle of the electrons from the sample relative to the electron-optical axis OA and the angle α the (half) opening angle of a beam bundle, which corresponds to a specific emission angle, of the momentum distribution image in the second reciprocal plane RP2. The amount of this opening angle α of the partial beams (virtually invisible in the detail in FIG. 2A but clearly visible in the detail in FIG. 2C) is determined by the size of the electron source area on the sample surface and hence by the cross-section of the exciting light beam and its angle of incidence onto the sample.

Realistic calculations were carried out for a practical embodiment of the electron imaging apparatus 100 according to the invention using a trajectory simulation program (SIMION 8.0), three of these being shown as examples in FIG. 2. The distance along the axial coordinate z between the surface of the sample 1 and the momentum distribution image in the second reciprocal plane RP2 is 462 mm. The electron-optical lenses are aberration-minimized and, in this case, a reduced image of the source area on the sample was set in the Gaussian plane GP1 with a magnification factor M=0.6. Other magnifications, even those with M>1, are likewise possible with the invention.

The simulations for an angular acceptance range of θ=15° deliver the following parameters: in all three cases, the momentum distribution image in the second reciprocal plane RP2 has a radius R of 4.3 mm. The tilts of the central rays of the beam (=deviation from the parallel beam) are all <0.09° and, as would be expected, are not dependent upon the size of the source area.

For excitation with synchrotron radiation or laser sources (FIG. 2A), 50 µm was assumed as a typical size for the light beam on the sample. Due to the large angular range of θ=15°, the first Gaussian image in the first Gaussian plane GP1 is widened by spherical aberration of the first lens group 10 and has a radius of r~40 μm. The partial beams in plane RP2 have an opening angle of α≤0.16°. This value is nearly two orders of magnitude smaller than the corresponding values of the angular divergence in the conventional transfer lens systems, as is shown in FIG. 7, for example.

Focused vacuum UV light sources (FIG. 2B) have typical light spot sizes of 200 μm. In this case, the first Gaussian image in the first Gaussian plane GP1 has a radius of 80 μm, and the opening angle of the beam, i.e. the resulting angular divergence in the momentum image in plane RP2 is α≤0.2°.

For unfocused vacuum UV laboratory sources (FIG. 2C), an exciting light beam has a typical diameter of e.g. 0.5 mm, which, in the first Gaussian plane GP1, produces a first Gaussian image with radius r=155 μm. Here, the opening angle of the beam in the plane RP2 is α~0.35°. The detail in FIG. 2C is greatly enlarged radially to make the small angle clear. The momentum distribution image in the second reciprocal plane RP2 is sharply focused in this case as well, and the electrons enter the energy analyzer apparatus 200 as parallel beams with minimal divergence.

Figure 3:
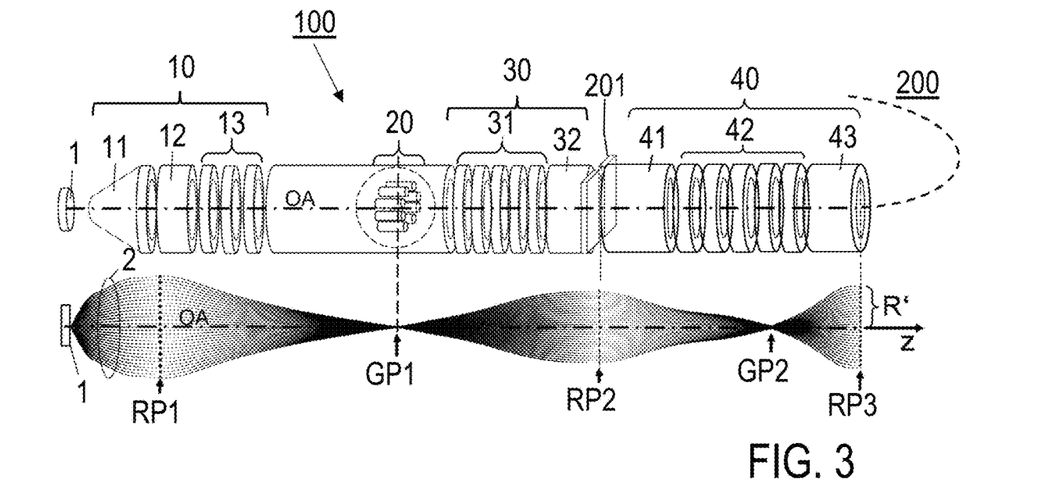
FIG. 3: a schematic illustration of the second embodiment of the electron imaging apparatus according to the invention.

FIG. 3 shows a preferred variant of the second embodiment of the electron imaging apparatus 100 according to the invention, wherein the components 10, 20 and 30 and their parts are provided, as in FIG. 1. Unlike in the first embodiment, a third lens group 40 is additionally provided and this generates a second Gaussian image on the analyzer side behind the slit diaphragm 201 in the second Gaussian plane GP2 and a third momentum distribution image with parallel partial beams in a third reciprocal plane RP3. The third reciprocal plane RP3 is the entry plane of the energy analyzer apparatus 200, so that the electrons 2 enter the energy analyzer apparatus 200 as a parallel bundle. The third lens group 40 comprises electron-optical lens elements 42, which form a zoom lens. The lens elements 42 and the associated control circuit (not shown) are configured such that the electron energy and the lateral magnification of the momentum distribution image in the reciprocal plane RP3 are variable, in order to optimize the energy- and/or momentum resolution of the energy analyzer apparatus 200. At both ends of the zoom lens comprising the lens elements 42, there are boundary elements 41 and 43 arranged to create field-free spaces at the ends of the zoom lens and minimize any feed-over of electrical fields from the region of the slit diaphragm 201 and the entry of the energy analyzer apparatus 200 in the third reciprocal plane RP3. In this embodiment, there is an image of the slit diaphragm 201 in the entry plane of the energy analyzer apparatus 200, but no physical slit, i.e. no physical slit diaphragm.

Figure 4:
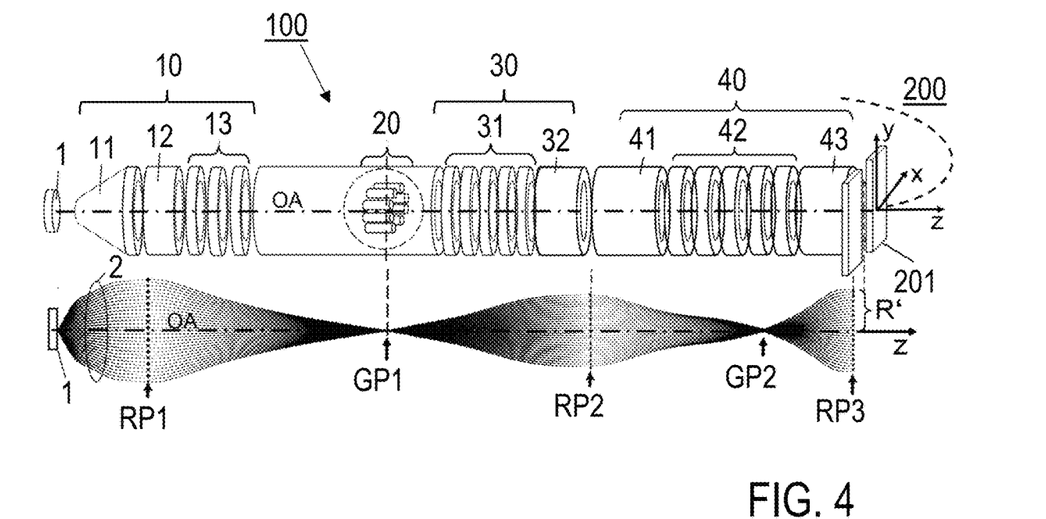
FIG. 4: a schematic illustration of the third embodiment of the electron imaging apparatus according to the invention.

FIG. 4 shows a preferred variant of the third embodiment of the electron imaging apparatus 100 according to the invention, wherein the third lens group 40 with the lens elements 42 and the boundary elements 41, 43 is also provided. However, with the third embodiment, the slit diaphragm 201 is arranged in the third reciprocal plane RP3 in the entry of the energy analyzer apparatus 200. In this case as well, the third lens group 40 comprises lens elements 42 forming a zoom lens, which allows varying the electron energy and the lateral magnification of the momentum distribution image in the third reciprocal plane RP3 in broad ranges, in order to optimize energy- and momentum resolution of the energy analyzer apparatus 200. In this case, a conventional energy analyzer with integral entrance slit can be used.

FIG. 5 shows variants of the deflector device 20, which can be provided in various embodiments. Thus, the deflector device 20 according to FIG. 5A comprises at least two electrodes 21 (termed parallel plate deflector) or, according to FIG. 5B, four electrodes 21 in one plane (termed x-y deflector) or, according to FIG. 5C, eight electrodes 21 in one plane (termed octupole arrangement or octupole deflector). The embodiment according to FIG. 5C is particularly advantageous, since deflection can take place in any arbitrary plane by means of suitable voltages on the eight electrodes 21, in order to align the deflection plane exactly along the x direction, that is to say exactly perpendicular to the direction of the entrance slit 201, as illustrated in FIGS. 1B and 1C. Moreover, the octupole arrangement makes it possible to correct undesirable image rotations due to longitudinal magnetic stray fields that might occur during the scanning process.

Figure 6:
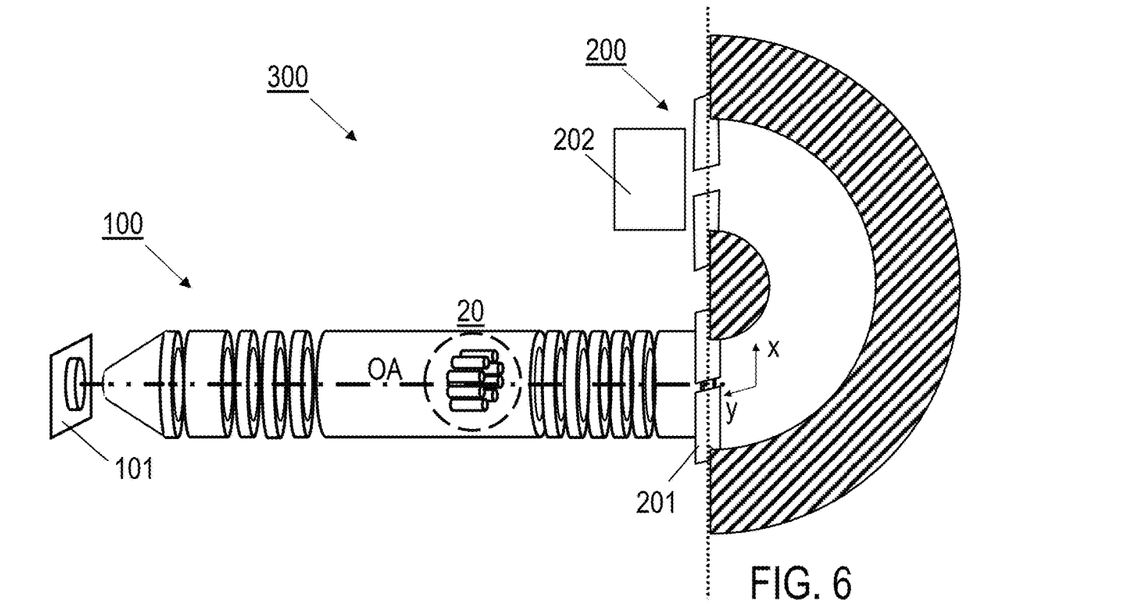
FIG. 6: a schematic illustration of an embodiment of the electron spectrometer apparatus according to the invention.

FIG. 6 is a diagram of an embodiment of the electron spectrometer apparatus 300, comprising the electron imaging apparatus 100, e.g. according to any of FIG. 1, 3 or 4, and the energy analyzer apparatus 200 in the form of a hemispherical analyzer with an electron detector 202. On implementation of the electron spectrometry method, the electrons emitted from the sample 1 on the sample-holder 101 are transferred by the electron imaging apparatus 100 along the electron-optical axis OA to the energy analyzer apparatus 200. An energy- and momentum distribution of the electrons is recorded by capturing momentum distribution images of the electrons along a first momentum coordinate along the slit diaphragm 201 and via the stepwise displacement of the momentum distribution image perpendicular to the slit diaphragm 201, so that the full two-dimensional momentum distribution can be recorded.

The features of the invention disclosed in the above description, the drawings and the claims are important for the realization of the invention in its various embodiments both individually or in combination or sub-combination.

LIST OF REFERENCE NUMERALS

100 Electron imaging apparatus
101 Sample-holder
200 Energy analyzer apparatus
201 Slit diaphragm
202 Electron detector
300 Electron spectrometer apparatus
1 Sample
2 Electrons
10 First lens group
11 Front cap electrode
12 Focusing electrode
13 Adapting lens
20 Deflector device
21 Deflector element
22 Drift tube
30 Second lens group
31 Lens elements
32 Boundary element
40 Third lens group
41 Boundary element
42 Zoom lens
43 Boundary element
50 Control device
RP1 First reciprocal plane (momentum image plane)
GP1 First Gaussian plane (plane of real space image)
RP2 Second reciprocal plane
GP2 Second Gaussian plane
RP3 Third reciprocal plane
OA Optical axis
θ Emission angle relative to OA α Opening angle of beam bundles
R Radius of the momentum distribution image
r Radius of the Gaussian image
x, y, z Directional coordinates
$k_x$, $k_y$, $k_z$ Momentum coordinates

What is claimed is:

1. An electron imaging apparatus that is configured for an electron transfer along an electron-optical axis from a sample emitting electrons to an energy analyzer apparatus and comprises a first lens group on a sample side and a second lens group on an analyzer side and a deflector device that is configured to deflect the electrons in an exit plane of the electron imaging apparatus in a deflection direction perpendicular to the electron-optical axis, wherein:
  the first lens group provides a first reciprocal plane inside the first lens group and a first Gaussian plane between the first and the second lens group and is configured to generate a first momentum distribution image of a momentum distribution of electrons from the sample in the first reciprocal plane and to generate a first Gaussian image of the sample in the first Gaussian plane,
  the second lens group provides a second reciprocal plane on the analyzer side of the second lens group and is configured to generate a second momentum distribution image of the momentum distribution of the electrons from the sample in the second reciprocal plane, and
  the first lens group is configured to generate the first Gaussian image in a front focal plane of the second lens group with such a small dimension that the second momentum distribution image generated by the second lens group is a parallel image.

2. The electron imaging apparatus according to claim 1, wherein the deflector device is configured such that the deflector device acts in one single plane perpendicular to the optical axis.

3. The electron imaging apparatus according to claim 1, wherein the deflector device comprises one single pair of at least one of electrically and magnetically acting deflector elements, a quadrupole arrangement of four deflector elements in one plane or an octupole arrangement of eight deflector elements in one plane.

4. The electron imaging apparatus according to claim 1, wherein:
  the second reciprocal plane is an exit plane of the electron imaging apparatus, and
  a slit diaphragm is arranged in the second reciprocal plane, forming an entry slit of the energy analyzer apparatus.

5. The electron imaging apparatus according to claim 1, further comprising:
  at least one third lens group, that is arranged on the analyzer side of the second lens group and forms a second Gaussian plane inside the at least one third lens group and a third reciprocal plane on the analyzer side of the at least one third lens group and is configured to generate a second Gaussian image of the sample in the second Gaussian plane and a third momentum distribution image of the momentum distribution of the electrons from the sample in the third reciprocal plane, wherein
  the third reciprocal plane is the exit plane of the electron imaging apparatus, and
  the third momentum distribution image generated by the at least one third lens group is a second parallel image.

6. The electron imaging apparatus according to claim 5, wherein a slit diaphragm is arranged in the second reciprocal plane, said slit diaphragm forming an entry slit of the energy analyzer apparatus by imaging into the entry plane of the energy analyzer apparatus.

7. The electron imaging apparatus according to claim 5, wherein a slit diaphragm is arranged in the third reciprocal plane, forming an entry slit of the energy analyzer apparatus, wherein no slit diaphragm is arranged in the second reciprocal plane.

8. The electron imaging apparatus according to claim 1, wherein the deflector device is arranged between the first and the second lens group and in the first Gaussian plane.

9. The electron imaging apparatus according to claim 5, wherein the deflector device is arranged at the third lens group and in the second Gaussian plane.

10. The electron imaging apparatus according to claim 1, wherein the first lens group is configured to generate the first Gaussian image with an extent perpendicular to the electron-optical axis of less than 1 mm.

11. The electron imaging apparatus according to claim 1, wherein the first and the second lens group are configured to form the parallel image with angular deviations of its partial beams of less than 0.4°.

12. The electron imaging apparatus according to claim 1, wherein a foremost sample-side electron-optical element of the first lens group is configured to have a same potential as the sample, so as to generate a field-free area in front of the sample.

13. The electron imaging apparatus according to claim 1, wherein the deflector device is coupled to a control device, which is configured for a scanning deflection of the electrons in the exit plane of the electron imaging apparatus while preserving the parallel image.

14. An electron spectrometer apparatus, comprising:
  a sample-holder configured to hold a sample,
  an electron imaging apparatus according to claim 1, and
  an energy analyzer apparatus,
  wherein the electron imaging apparatus is configured for electron transfer of electrons emitted from the sample along the electron-optical axis to the energy analyzer apparatus.

15. The electron spectrometer apparatus according to claim 14, wherein the energy analyzer apparatus comprises a hemispherical analyzer.

16. An electron transfer method, wherein electrons from a sample are transferred by an electron imaging apparatus along an electron-optical axis to an energy analyzer apparatus, wherein the electrons pass in sequence through a sample-side first lens group and an analyzer-side second lens group and the electrons are deflected by a deflector device in an exit plane of the electron imaging apparatus in a deflection direction perpendicular to the electron-optical axis, wherein:
  the first lens group forms a first reciprocal plane inside the first lens group and a first Gaussian plane between the first and the second lens group and generates a first momentum distribution image of a momentum distribution of electrons from the sample in the first reciprocal plane and a first Gaussian image of the sample in the first Gaussian plane,
  the second lens group forms a second reciprocal plane on the analyzer side of the second lens group and generates a second momentum distribution image of the momentum distribution of the electrons from the sample in the second reciprocal plane, and
  the first lens group generates the first Gaussian image in a front focal plane of the second lens group with such a small dimension that the second momentum distribution image generated by the second lens group is a parallel image.

17. The electron transfer method according to claim 16, wherein the deflector device is configured such that the deflector device acts in one single plane perpendicular to the optical axis.

18. The electron transfer method according to claim 16, wherein:
the second reciprocal plane is the exit plane of the electron imaging apparatus, and
a slit diaphragm that forms an entrance slit of the energy analyzer apparatus is arranged in the second reciprocal plane.

19. The electron transfer method according to claim 16, wherein at least one third lens group that is arranged on the analyzer side of the second lens group forms a second Gaussian plane inside the at least one third lens group and a third reciprocal plane on the analyzer side of the at least one third lens group and generates a second Gaussian image of the sample in the second Gaussian plane and a third momentum distribution image of the momentum distribution of the electrons from the sample in the third reciprocal plane, wherein:
the third reciprocal plane is the exit plane of the electron imaging apparatus, and
the third momentum distribution image generated by the at least one third lens group is a second parallel image.

20. The electron transfer method according to claim 19, wherein a slit diaphragm is arranged in the second reciprocal plane, said slit diaphragm forming an entry slit of the energy analyzer apparatus by imaging into the entry plane of the energy analyzer apparatus.

21. The electron transfer method according to claim 19, wherein a slit diaphragm is arranged in the third reciprocal plane, forming an entry slit of the energy analyzer apparatus, wherein no slit diaphragm is arranged in the second reciprocal plane.

22. The electron transfer method according to claim 16, wherein the deflector device is arranged in the first Gaussian plane.

23. The electron imaging apparatus according to claim 19, wherein the deflector device is arranged at the at least one third lens group and in the second Gaussian plane.

24. The electron transfer method according to claim 16, wherein the first lens group generates the first Gaussian image with an extent perpendicular to the electron-optical axis of less than 1 mm.

25. The electron transfer method according to claim 16, wherein the first and the second lens group are configured to form the parallel image with angular deviations of its partial beams of less than 0.4°.

26. The electron transfer method according to claim 16, wherein a foremost sample-side electron-optical element (11) of the first lens group has the same potential like the sample, so as to generate a field-free area in the region of the sample.

27. The electron transfer method according to claim 16, wherein the electrons in the exit plane of the electron imaging apparatus are deflected to generate a scanning motion of the momentum distribution image while preserving the parallel image.

28. An electron spectroscopy method, comprising the steps:
irradiation of a sample and emission of electrons from the sample,
transfer of the electrons emitted from the sample by an electron transfer method according to claim 16 to an energy analyzer apparatus, and
energy-resolved detection of electrons by the energy analyzer apparatus.

29. The electron spectrometry method according to claim 28, wherein the energy analyzer apparatus comprises a hemispherical analyzer.

\* \* \* \* \*